(12) United States Patent
Lee

(10) Patent No.: US 7,442,946 B2
(45) Date of Patent: Oct. 28, 2008

(54) NONUNIFORM ION IMPLANTATION APPARATUS AND METHOD USING A WIDE BEAM

(75) Inventor: Min Yong Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 230 days.

(21) Appl. No.: 11/315,776

(22) Filed: Dec. 21, 2005

(65) Prior Publication Data

US 2007/0023696 A1 Feb. 1, 2007

(30) Foreign Application Priority Data

Jun. 29, 2005 (KR) ............... 10-2005-0057361

(51) Int. Cl.
*H01J 37/08* (2006.01)

(52) U.S. Cl. ............... 250/492.21; 250/492.23; 250/491.1; 250/492.3; 118/723 CB; 118/723 FI; 118/723 MR; 118/723 MA

(58) Field of Classification Search ............ 250/492.21, 250/492.23, 491.1, 492.3; 118/723 CB, 723 FI, 118/723 MR, 723 MA
See application file for complete search history.

(56) References Cited

U.S. PATENT DOCUMENTS

| | | | |
|---|---|---|---|
| 5,126,575 A * | 6/1992 | White ............... 250/492.3 |
| 5,483,077 A | 1/1996 | Glavish | |
| 5,834,786 A * | 11/1998 | White et al. ......... 250/492.21 |
| 6,055,460 A * | 4/2000 | Shopbell .............. 700/121 |
| 6,750,462 B2 * | 6/2004 | Iwasawa et al. ....... 250/492.3 |
| 6,918,351 B2 * | 7/2005 | Chen et al. ........... 118/723 CB |
| 7,118,996 B1 * | 10/2006 | Yamazaki et al. ....... 438/514 |
| 2003/0200930 A1 * | 10/2003 | Chen et al. ........... 118/723 FI |

FOREIGN PATENT DOCUMENTS

| | | |
|---|---|---|
| EP | 0 444 935 B1 | 10/1996 |
| JP | 05050181 | 2/1993 |
| JP | 04029652 | 9/1993 |
| KR | 1019990058609 | 7/1999 |
| KR | 1020040032799 | 11/2005 |

* cited by examiner

*Primary Examiner*—Jack I. Berman
*Assistant Examiner*—Michael Maskell
(74) *Attorney, Agent, or Firm*—Townsend and Townsend and Crew LLP

(57) ABSTRACT

A nonuniform ion implantation apparatus comprises a wide ion beam generator for generating a wide ion beam including a plurality of wide ion beams irradiated on at least two sections among a plurality of sections into which a wafer is divided, and a wafer drive unit for vertically reciprocating the wafer while the wide ion beam generated by the wide ion beam generator is irradiated on the wafer. At least one of the wide ion beams has a dose different from that of at least another wide ion beam.

6 Claims, 17 Drawing Sheets

NONUNIFORM ION IMPLANTATION APPARATUS AND METHOD USING A WIDE BEAM

CROSS REFERENCE TO RELATED APPLICATIONS

The present application claims priority to Korean Patent Application No. 10-2005-0057361, filed on Jun. 29, 2005 which is incorporated by reference.

BACKGROUND OF THE INVENTION

The present invention relates to a semiconductor manufacturing apparatus and method, and, more particularly, to a nonuniform ion implantation apparatus and method capable of implanting dopant ions of different doses into different regions of a wafer.

Generally, a large number of processes are carried out to manufacture a semiconductor device, especially, a semiconductor memory device, such as a dynamic random access memory (DRAM). The processes employed may include a stack formation process, an etch process, and an ion implantation process which are carried out for each wafer. In particular, the ion implantation process accelerates dopant ions such as boron or arsenic using an electric field so that the dopant ions can be transmitted through layers present on the surface of the wafer. The electric properties of materials can be changed through the ion implanting process.

FIG. 1 is a view schematically illustrating a conventional ion implantation apparatus used to carry out an ion implantation process.

Referring to FIG. 1, a conventional ion implantation apparatus comprises a quadruple magnetic pole assembly 110, an X-directional scanner 120, a beam collimator 130, and an accelerator 140. Quadruple magnetic pole assembly 110 serves to magnify and reduce an ion beam 102 emitted from an ion beam source (not shown). Quadrupole magnetic pole assembly 110 has quadruple magnetic poles for generating magnetic fields in the areas between the four magnetic poles. Quadruple magnetic pole assembly 110 includes a first magnetic pole assembly 111 having two S and N magnetic poles and a second magnetic pole assembly 112 having two S and N magnetic poles. X-directional scanner 120 serves to orient the ion beam 102 in the X direction such that the ion beam can be uniformly irradiated on a wafer 101. Beam collimator 130 serves to collimate the optical path of ion beam 102. Accelerator 140 serves to accelerate charged particles. Accelerator 140 may be disposed before X-directional scanner 120 according to the circumstances. Ion beam 102 is irradiated on the surface of wafer 101 while ion beam 102 is oriented in the X direction by the conventional ion implantation apparatus with the above-stated construction. At this time, the wafer is moved in the Y direction such that ion implantation is performed over the entire surface of wafer 101.

FIG. 2 is a view illustrating the operation of a Y-directional scanner for scanning the wafer 101 in the Y direction.

Referring to FIG. 2, a supporting member (not shown), which is provided to support wafer 101, is connected to a Y-directional drive shaft 210. Y-directional drive shaft 210 is connected to a drive unit 220. Y-directional drive shaft 210 is moved in the Y direction by drive unit 220 as indicated by an arrow 211. As a result, wafer 101 is also moved in the Y direction. While wafer 101 is moved in the Y direction, ion beam 102 is irradiated on wafer 101 while the ion beam is oriented in the X direction, as indicated by an arrow 103. Reference numeral 104 indicates a moving trace of ion beam 102. A first ion beam detector 231 and a second ion beam detector 232 are disposed before and after the wafer 101, respectively, for detecting doses of dopant ions implanted while the ion implanting process is carried out to provide information regarding the dosage being applied.

When the ion implanting process is carried out using the conventional ion implantation apparatus described in FIGS. 1 and 2, dopant ions having the same concentration are implanted onto the entire surface of the wafer 101. However, the implantation of dopant ions having the same concentration may not be desirable, especially when taken in conjunction with other subsequent processes. Specifically, results obtained after subsequent processes are carried out such as the thickness of the stacked layer and the degree of etching may not be uniform over the entire surface of the wafer because variables in subsequent processes are not accurately controlled. As a result, process errors can occur due to unexpected or inaccurately controlled process variables.

When a gate electrode is formed, for example, the critical dimension (hereinafter referred to as "CD") indicating the width of the gate electrode may be changed depending upon the position of the wafer. The CD of the gate electrode may be larger in the left region of the wafer while the CD of the gate electrode may be smaller in the right region of the wafer. Alternatively, the CD of the gate electrode may be larger in the right region of the wafer while the CD of the gate electrode may be smaller in the left region of the wafer. As mentioned above, this difference can occur because many variables within other processes are not accurately controlled. When the CD of the gate electrode in the left region of the wafer is larger than that of the gate electrode in the right region of the wafer, the threshold voltage of the device in the left region of the wafer is higher than that of the device in the right region of the wafer. When the CD of the gate electrode in the right region of the wafer is larger than that of the gate electrode in the left region of the wafer, on the other hand, the threshold voltage of the device in the left region of the wafer is lower than that of the device in the right region of the wafer.

The CD difference of the gate electrode depending upon the position of the wafer can cause problems as the integration level of the device is increased. When the minimum allowable CD of the gate electrode is a larger amount such as 200 nm, for example, the reduction of yield rate due to a ±10% variation in CD values may be acceptable. However, when the minimum allowable CD of the gate electrode is reduced to 100 nm or less, however, a ±10% variation in CD distribution may represent an even worse result. Consequently, for smaller allowable CD values, the CD distribution should be set to a smaller range, for example, ±5%. Despite this change, the process margin and yield rate are still reduced, which may be an obstacle for chip manufacturers.

BRIEF SUMMARY OF THE INVENTION

According to the present invention, methods and apparatuses related to ion implantation are provided. More particularly, a nonuniform ion implantation apparatus is provided that is capable of implanting dopant ions having different doses into different regions of a wafer. In a specific embodiment, the wafer is provided with uniform device properties while forming a boundary line between a high-concentration dopant ion implantation area and a low-concentration dopant ion implantation area. Merely by way of example, the invention has been applied to ion implantation of semiconductor wafers, but it would be recognized that the invention has a much broader range of applicability.

In a specific embodiment of the invention, a nonuniform ion implantation method is provided that is capable of implanting dopant ions having different doses into different regions of a wafer. In a specific embodiment, the nonuniform implantation process can provide the wafer with uniform device properties while forming a boundary line between a high-concentration dopant ion implantation area and a low-concentration dopant ion implantation area.

In a specific embodiment an apparatus used in a nonuniform ion implantation process is provided, comprising a wide ion beam generator configured to generate a plurality of wide ion beams, the wide ion beams irradiating more than one of a plurality of sections on a wafer and a wafer drive unit for moving the wafer while the wide ion beams are irradiated on the wafer by the wide ion beam generator.

In a specific embodiment the movement of the wafer by the wafer drive unit is in a vertical and/or horizontal direction.

In a specific embodiment the movement of the wafer by the wafer drive unit is in a rotational manner.

In a specific embodiment at least one of the wide ion beams has a dose different from that of another wide ion beam.

In a specific embodiment the plurality of wide ion beams includes a first wide ion beam and a second wide ion beam irradiated, respectively, upon a first section and a second section of the wafer.

In a specific embodiment the first wide ion beam and the second wide ion beam have different doses.

In a specific embodiment the first section and the second section of the wafer are separated from each other by a boundary line.

In a specific embodiment the boundary line is either a vertical or horizontal boundary line.

In a specific embodiment the first section and the second section of the wafer comprise the entire surface area of the wafer.

In a specific embodiment the first section and the second section comprise at least half of the surface area of the wafer.

In a specific embodiment a nonuniform ion implantation apparatus is provided, comprising, a wide ion beam generator, including an upper magnetron assembly comprising a first upper magnetron assembly and a second upper magnetron assembly, and a lower magnetron assembly comprising a first lower magnetron assembly and a second lower magnetron assembly disposed below the first upper magnetron assembly and the second upper magnetron assembly, such that the first lower magnetron assembly and the second lower magnetron assembly are vertically spaced a predetermined distance from the first upper magnetron assembly and the second upper magnetron assembly, the upper and lower magnetron assemblies configured to generate a plurality of wide ion beams comprising at least a first wide ion beam generated between the first upper magnetron assembly and the first lower magnetron assembly and a second wide ion beam generated between the second upper magnetron assembly and the second lower magnetron assembly; and a wafer drive unit for moving a wafer on which the wide ion beam is irradiated by the wide ion beam generator.

In a specific embodiment the moving of the wafer is done in a vertical and/or horizontal direction.

In a specific embodiment the apparatus further comprises an ion beam source for generating an ion beam, and a magnetic pole assembly for magnifying and reducing an ion beam emitted from an ion beam source.

In a specific embodiment the width of either the lower or upper magnetron assemblies is greater than the diameter of the wafer.

In a specific embodiment one or more of the first upper magnetron assembly, second upper magnetron assembly, first lower magnetron assembly, and second lower magnetron assembly comprise a plurality of magnetron elements.

In a specific embodiment the number of magnetron elements in the first upper magnetron assembly and the first lower magnetron assembly is equal to the number of magnetron elements in the second upper magnetron assembly and the second lower magnetron assembly.

In a specific embodiment the number of magnetron elements in the first upper magnetron assembly and the first lower magnetron assembly is not equal to the number of magnetron elements in the second upper magnetron assembly and second lower magnetron assembly.

In a specific embodiment the voltage applied to the first upper magnetron assembly and the first lower magnetron assembly is not equal to the voltage applied to the second upper magnetron assembly and the second lower magnetron assembly.

In a specific embodiment a nonuniform ion implantation method is provided, the method comprising, irradiating a plurality of wide ion beams on a wafer, the wide ion beams comprising at least a first wide ion beam having a first dose and a second wide ion beam having a second dose different from the first dose, and moving the wafer while the wide ion beam is irradiated on the wafer.

In a specific embodiment the moving of the wafer is performed in a horizontal and/or vertical direction.

In a specific embodiment the plurality of wide ion beams cover an area equal to at least half of the surface area of the wafer.

In a specific embodiment the plurality of wide ion beams cover an area equal to at least the surface area of the wafer.

In a specific embodiment the wafer is rotated prior to performing the irradiating and moving processes.

In a specific embodiment the wafer is moved in a vertical and/or horizontal direction prior to performing the irradiating and moving processes.

Various additional objects, features, and advantages of the present invention can be more fully appreciated with reference to the detailed description and accompanying drawings that follow.

DETAILED DESCRIPTION OF THE INVENTION

Now, specific embodiments of the present invention will be described in detail with reference to the accompanying drawings. It should be noted, however, that the following embodiments of the present invention may take different forms, and therefore, the scope of the present invention is not limited by the following embodiments.

Figure 1:
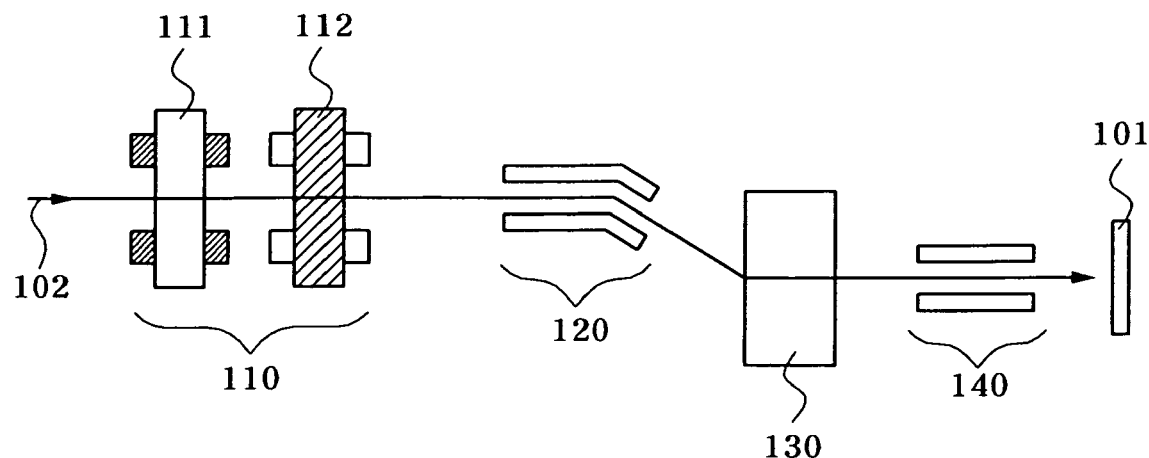
FIG. 1 is an exemplary simplified view illustrating a conventional ion implantation apparatus.
Figure 2:
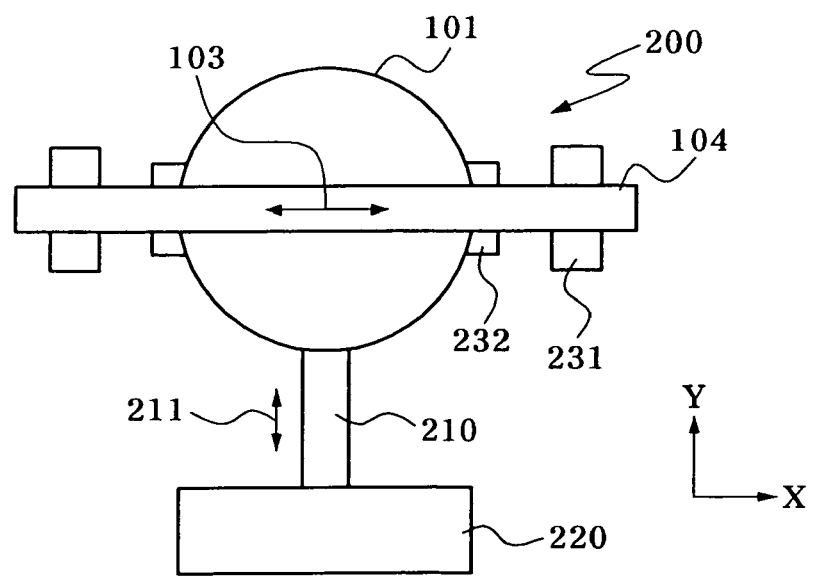
FIG. 2 is an exemplary simplified view illustrating the operation of a Y-directional scanner to the wafer shown in FIG. 1.
Figure 3:
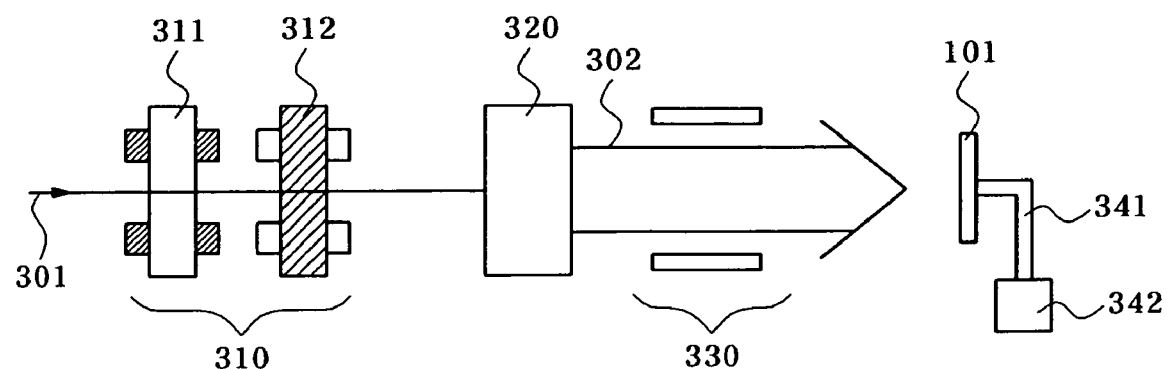
FIG. 3 is an exemplary simplified view schematically illustrating a nonuniform ion implantation apparatus.

FIG. 3 is an exemplary simplified view schematically illustrating a nonuniform ion implantation apparatus according to the present invention.

Referring to FIG. 3, the nonuniform ion implantation apparatus comprises: a quadruple magnetic pole assembly 310 for magnifying and reducing an ion beam 301 emitted from an ion beam source; a wide ion beam generator 320 for transforming ion beam 301 transmitted from the quadruple magnetic pole assembly 310 into a plurality of wide ion beams 320 and emitting wide ion beams 320; and an accelerator 330 for accelerating charged particles. The nonuniform ion implantation apparatus further comprises a drive shaft 341 and a drive unit 342 for moving a wafer 101 in a predetermined direction.

Quadruple magnetic pole assembly 310 has quadruple magnetic poles for generating magnetic fields in gaps between the four magnetic poles. Quadruple magnetic pole assembly 310 includes a first magnetic pole assembly 311 having S and N magnetic poles and a second magnetic pole assembly 312 having S and N magnetic poles.

Wide ion beam generator 320 serves to transform ion beam 301 exiting from quadruple magnetic pole assembly 310 into wide ion beams and emit the wide ion beams. Wide ion beam generator 320 includes multi-pole magnetron assemblies to change the concentration of dopant ions according to different areas on the wafer to be implanted. Wide ion beam generator 320 will be described hereinafter in detail.

Accelerator 330 serves to accelerate charged particles. In a specific embodiment, accelerator 330 may be disposed before wide ion beam generator 320.

Figure 4:
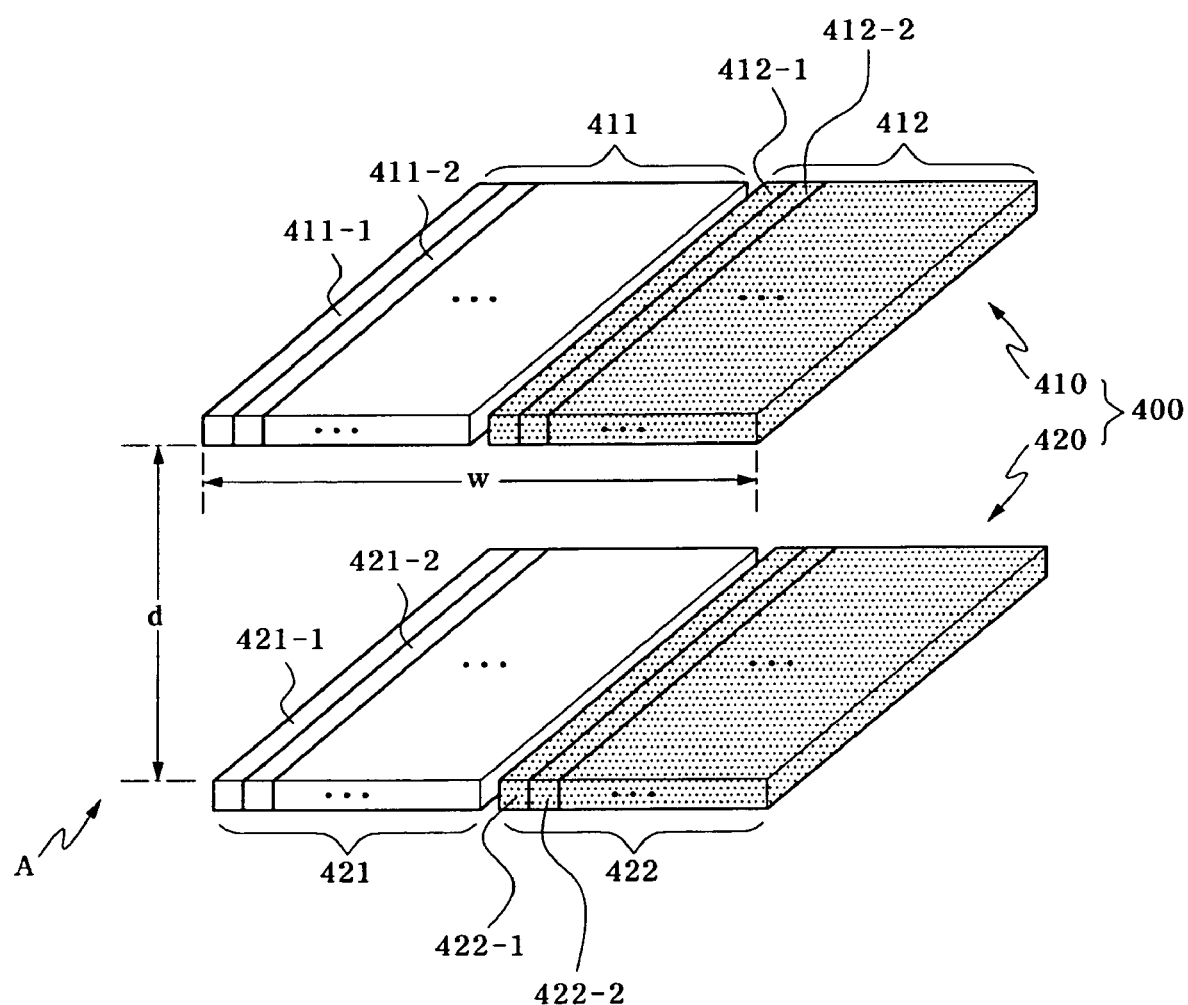
FIG. 4 is an exemplary simplified view illustrating a wide ion beam generator of the nonuniform ion implantation apparatus shown in FIG. 3.
Figure 5:
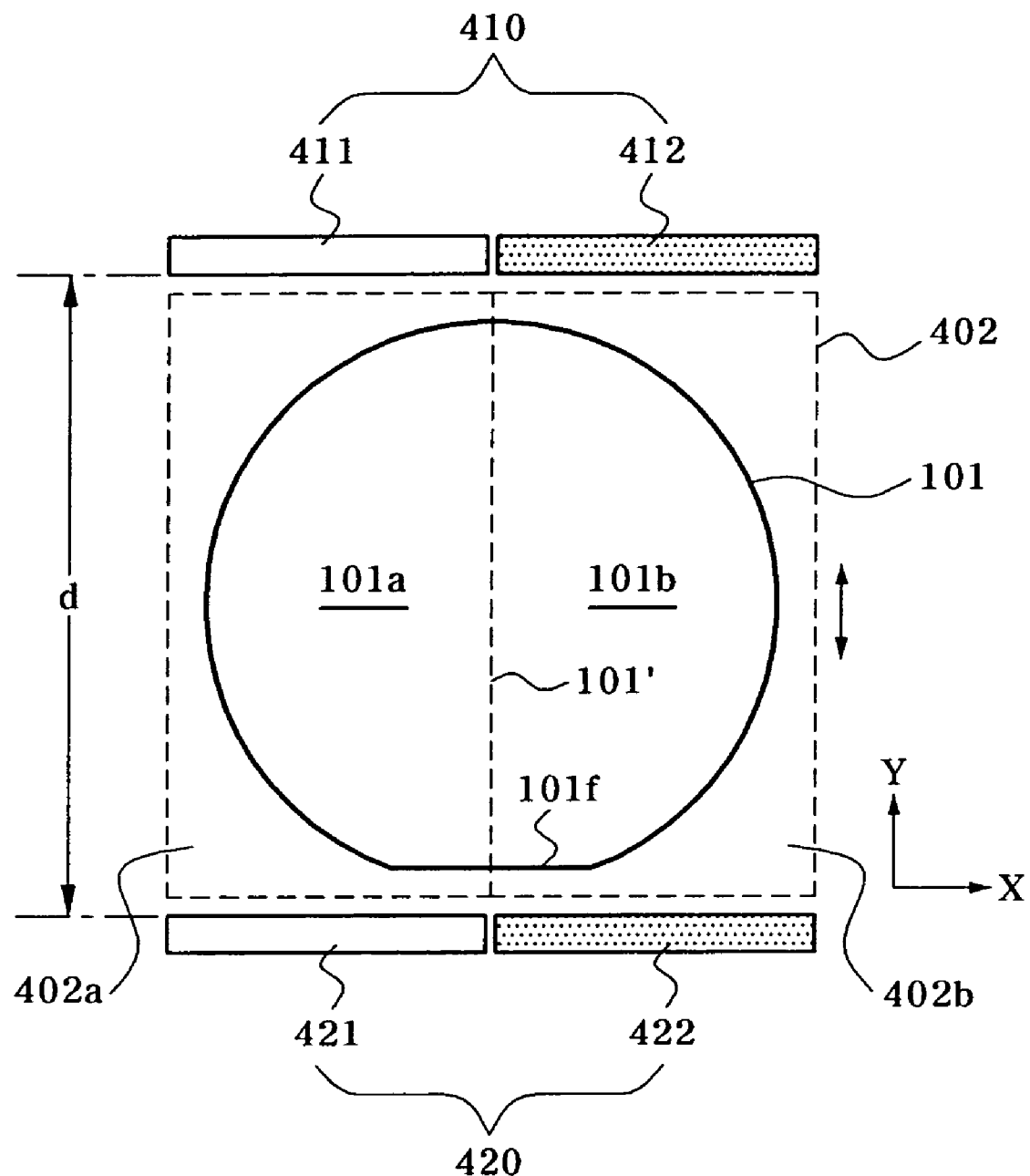
FIG. 5 is an exemplary simplified view of an example of the wafer and the wide ion beam generator shown in FIG. 4 seen in the direction indicated by arrow A.

FIG. 4 is an exemplary simplified view illustrating a wide ion beam generator 400 of the nonuniform ion implantation apparatus shown in FIG. 3, and FIG. 5 is an exemplary simplified view of an example of the wafer and wide ion beam generator 400 shown in FIG. 4 seen in the direction indicated by the arrow A.

Referring to FIGS. 4 and 5, wide ion beam generator 400 comprises: an upper magnetron assembly 410 and a lower magnetron assembly 420 disposed below upper magnetron assembly 410 such that lower magnetron assembly 420 is vertically spaced a predetermined distance d from upper magnetron assembly 410. The vertical distance d between upper magnetron assembly 410 and lower magnetron assembly 420 is greater than the diameter of wafer 101. Also, the width w of the upper magnetron assembly 410 is greater than the diameter of wafer 101, and the width w of lower magnetron assembly 420 is greater than the diameter of wafer 101. In a specific embodiment, wide ion beam generator 400 generates a plurality of wide ion beams 402 having an area larger than the entire area of wafer 101.

Upper magnetron assembly 410 includes a first upper magnetron assembly 411 comprising a plurality of magnetron elements 411-1, 411-2, . . . , which are attached to each other side by side, and a second upper magnetron assembly 412 comprising a plurality of magnetron elements 412-1, 412-2, . . . , which are attached to each other side by side. In a specific embodiment the number of magnetron elements 411-1, 411-2, . . . present in the first upper magnetron assembly is equal to the number of magnetron elements 412-1, 412-2, . . . present in the second upper magnetron assembly Magnetron elements 411-1, 411-2, . . . and magnetron elements 412-1, 412-2, . . . are connected to a power source (not shown), through which different voltages can be applied to first upper magnetron assembly 411 and second upper magnetron assembly 412. In a specific embodiment a relatively low voltage is applied to magnetron elements 411-1, 411-2, . . . of first upper magnetron assembly 411, and a relatively high voltage is applied to the magnetron elements 412-1, 412-2, . . . of second upper magnetron assembly 412. In a specific embodiment, the relatively high voltage may be applied to magnetron elements 411-1, 411-2, . . . of first upper magnetron assembly 411, and the relatively low voltage may be applied to magnetron elements 412-1, 412-2, . . . of second upper magnetron assembly 412.

Lower magnetron 420 includes a first lower magnetron assembly 421 comprising a plurality of first magnetron elements 421-1, 421-2, . . . , which are attached to each other side by side, and a second lower magnetron assembly 422 comprising a plurality of magnetron elements 422-1, 422-2, . . . , which are attached to each other side by side. In a specific embodiment, the number of magnetron elements 421-1, 421-2, . . . present in first lower magnetron assembly 421 is equal to that of magnetron elements 422-1, 422-2, . . . present in second lower magnetron assembly 422. Magnetron elements 421-1, 421-2, . . . and magnetron elements 422-1, 422-2, . . . are connected to a power source (not shown), from which different voltages can be applied to first lower magnetron assembly 421 and second lower magnetron assembly 422. In a specific embodiment, a relatively low voltage is applied to magnetron elements 421-1, 421-2, . . . of first lower magnetron assembly 421, and a relatively high voltage is applied to magnetron elements 422-1, 422-2, . . . of second lower magnetron assemblies 422. In a specific embodiment the relatively high voltage may be applied to magnetron elements 421-1, 421-2, . . . of first lower magnetron assembly 421, and the relatively low voltage may be applied to magnetron elements 422-1, 422-2, ... of second lower magnetron assembly 422.

In a specific embodiment, magnetron elements 411-1, 411-2, ... of first upper magnetron assembly 411 and magnetron elements 421-1, 421-2, ... of first lower magnetron assembly 421 are opposite to each other while being vertically (Y direction) spaced a predetermined distance d from each other. In the same manner, magnetron elements 412-1, 412-2, ... of second upper magnetron assembly 412 and magnetron elements 422-1, 422-2, ... of second lower magnetron assembly 422 are opposite each other while being vertically (Y direction) spaced a predetermined distance d from each other.

In a specific embodiment, the same voltage is applied to first upper magnetron assembly 411 and first lower magnetron assembly 421, and the same voltage is applied to second upper magnetron assembly 412 and second lower magnetron assembly 422. Specifically, the relatively low voltage is applied to first upper magnetron assembly 411 and first lower magnetron assembly 421, and the relatively high voltage is applied to second upper magnetron assembly 412 and second lower magnetron assembly 422. In a specific embodiment, the relatively high voltage may be applied to first upper magnetron assembly 411 and first lower magnetron assembly 421, and the relatively low voltage may be applied to second upper magnetron assembly 412 and second lower magnetron assembly 422.

As the voltages are applied to upper magnetron assembly 410 and lower magnetron assembly 420 in the above-mentioned manner, a plurality of wide beams 402 having a predetermined area are generated in the region between upper magnetron assembly 410 and lower magnetron assembly 420. In a specific embodiment, an area larger than the area of wafer 101 may be generated. When the relatively low voltage is applied to first upper magnetron assembly 411 and first lower magnetron assembly 421, and the relatively high voltage is applied to second upper magnetron assembly 412 and second lower magnetron assembly 422, wide ion beams 402 comprise: a first wide ion beam 402a having a relatively low dose between first upper magnetron assembly 411 and first lower magnetron assembly 421; and a second wide ion beam 402b having a relatively high dose between second upper magnetron assembly 412 and second lower magnetron assembly 422. When a high voltage is applied to first upper magnetron assembly 411 and first lower magnetron assembly 421, and a low voltage is applied to second upper magnetron assembly 412 and second lower magnetron assembly 422, first wide ion beam 402a has a relatively high dose, and second wide ion beam 402b has a relatively low dose.

Now, a nonuniform ion implantation method using the ion implantation apparatus adopting wide ion beam generator 400 with the above-stated construction will be described with reference to FIGS. 3 to 5.

First, ion beam 302 transmitted from quadruple magnetic pole assembly 310 is transformed into wide beams 402 by wide ion beam generator 400, and wide beams 402 are irradiated on wafer 101. In a specific embodiment, wide ion beams 402 comprise first wide ion beam 402a having a low dose and second wide ion beam 402b having a high dose. Wafer 101 is disposed such that a flat zone 101f of wafer 101 faces downward. As indicated by the arrow in the drawings, wafer 101 is moved vertically, i.e., in the Y direction, by the drive shaft 341 and drive unit 342. As a result, dopant ions having different doses are implanted into a first region 101a of wafer 101, i.e., the left side part of wafer 101, and a second region 101b of wafer 101, i.e., the right side part of wafer 101, which are separated from each other by a boundary line 101', respectively. Boundary line 101' is a line connecting the boundary between first upper magnetron assembly 411 and second upper magnetron assembly 412 and the boundary between first lower magnetron assembly 421 and second lower magnetron assembly 422. Consequently, dopant ions having a relatively low dose are implanted into first region 101a of wafer 101, and dopant ions having a relatively high dose are implanted into second region 101b of wafer 101. In a specific embodiment, the difference in dose between the dopant ions in the vicinity of boundary line 101' is considerably increased.

Figure 6:
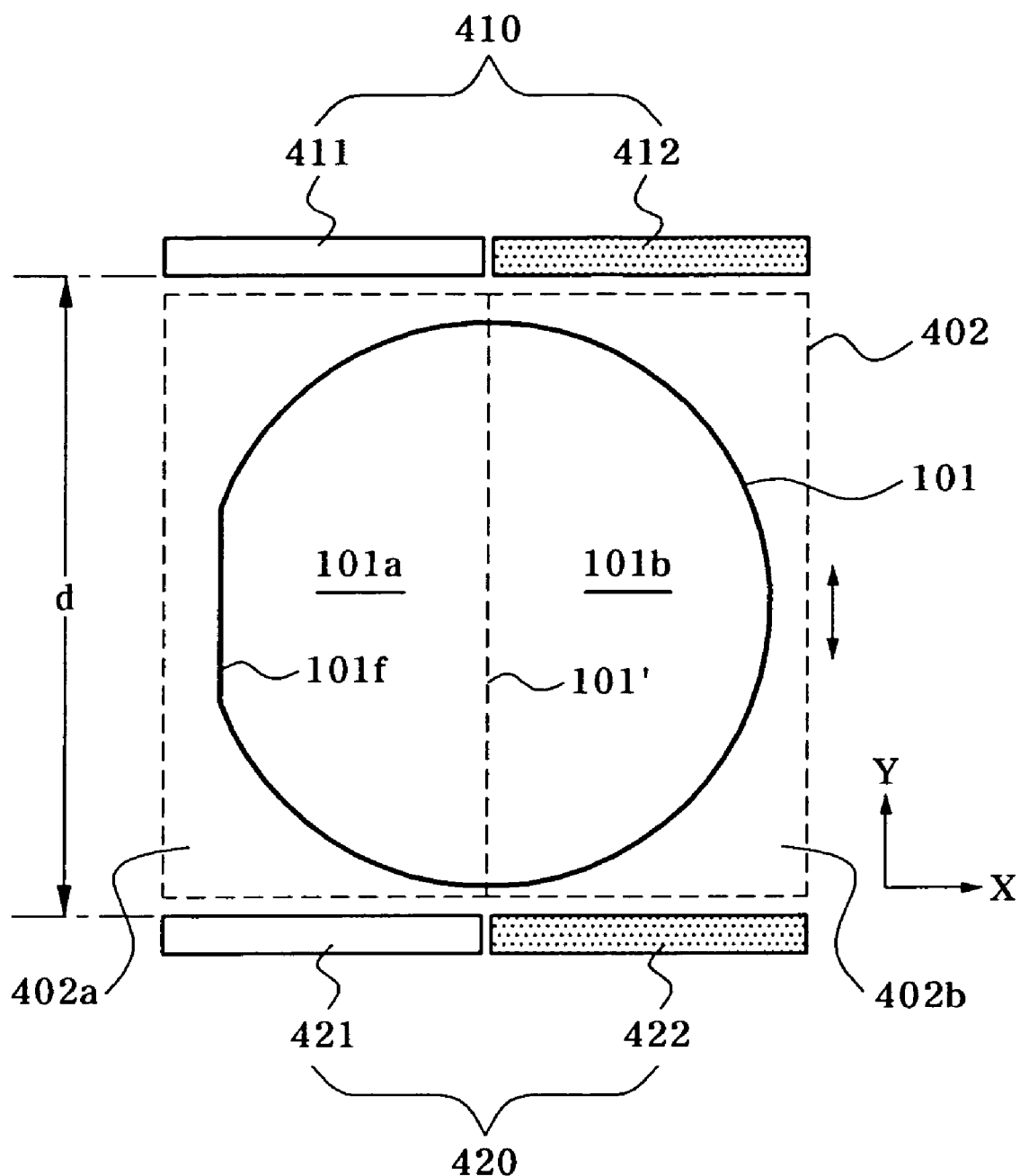
FIG. 6 is an exemplary simplified view of another example of the wafer and the wide ion beam generator shown in FIG. 4 seen in the direction indicated by arrow A.

FIG. 6 is an exemplary simplified view of an example of the wafer and the wide ion beam generator shown in FIG. 4 seen in the direction indicated by the arrow A.

Referring to FIG. 6, this example is different from the example shown in FIG. 5 in that the flat zone 101f of wafer 101 faces left. When the nonuniform ion implantation method is performed under the condition that wafer 101 is rotated a predetermined angle as shown in FIG. 6, dopant ions having different doses are implanted into first region 101a of wafer 101, which is adjacent to flat zone 101f of wafer 101, and second region 101b of wafer 101, which is far away from flat zone 101f of wafer 101, respectively. In a specific embodiment, the wafer 101 is rotated an angle of 90 degrees clockwise from the position as shown in FIG. 5, and then a nonuniform ion implantation method is performed. In a specific embodiment, dopant ions having different doses may be implanted into one side part and other side part of the wafer 101, which are separated from each other by boundary line 101', respectively, according to the rotating angle of wafer 101.

Figure 7:
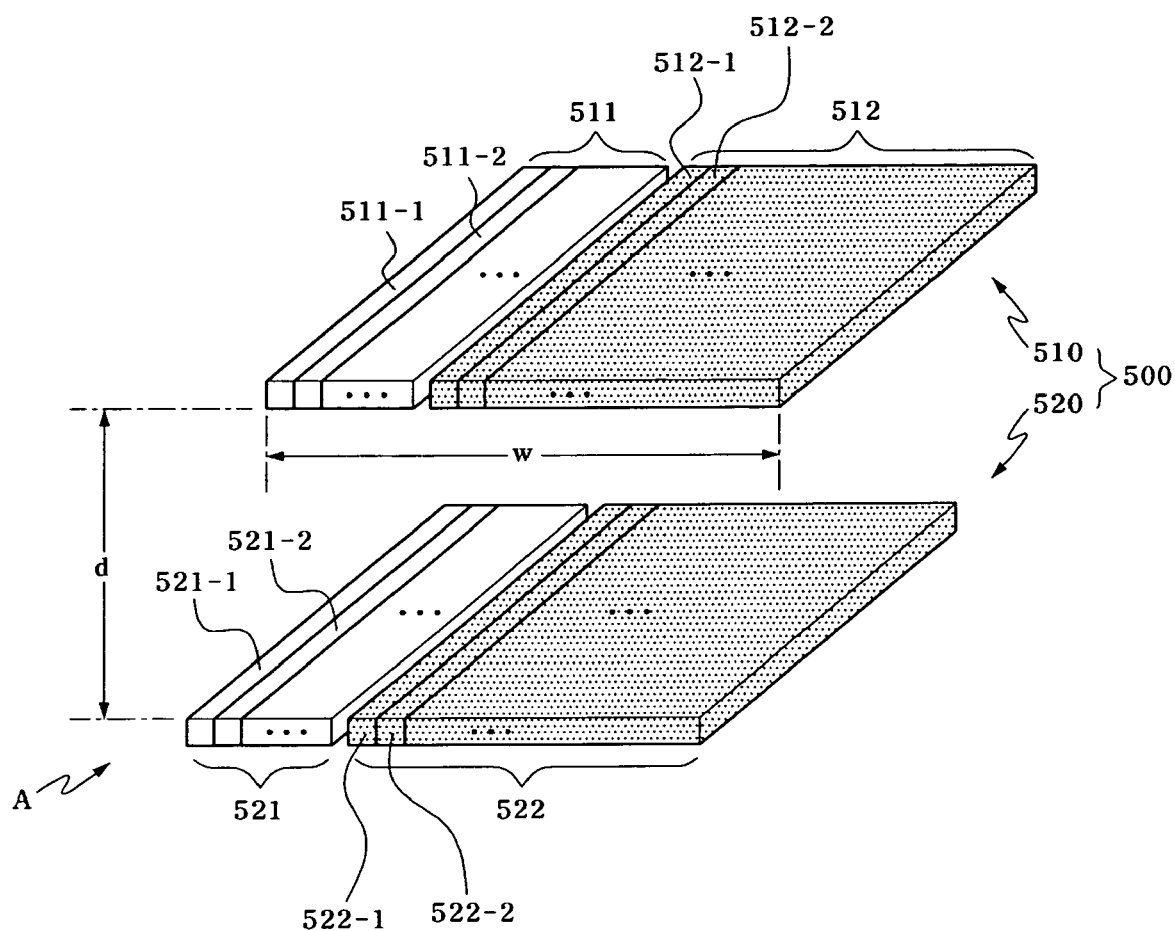
FIG. 7 is an exemplary simplified view illustrating a wide ion beam generator of the nonuniform ion implantation apparatus shown in FIG. 3.
Figure 8:
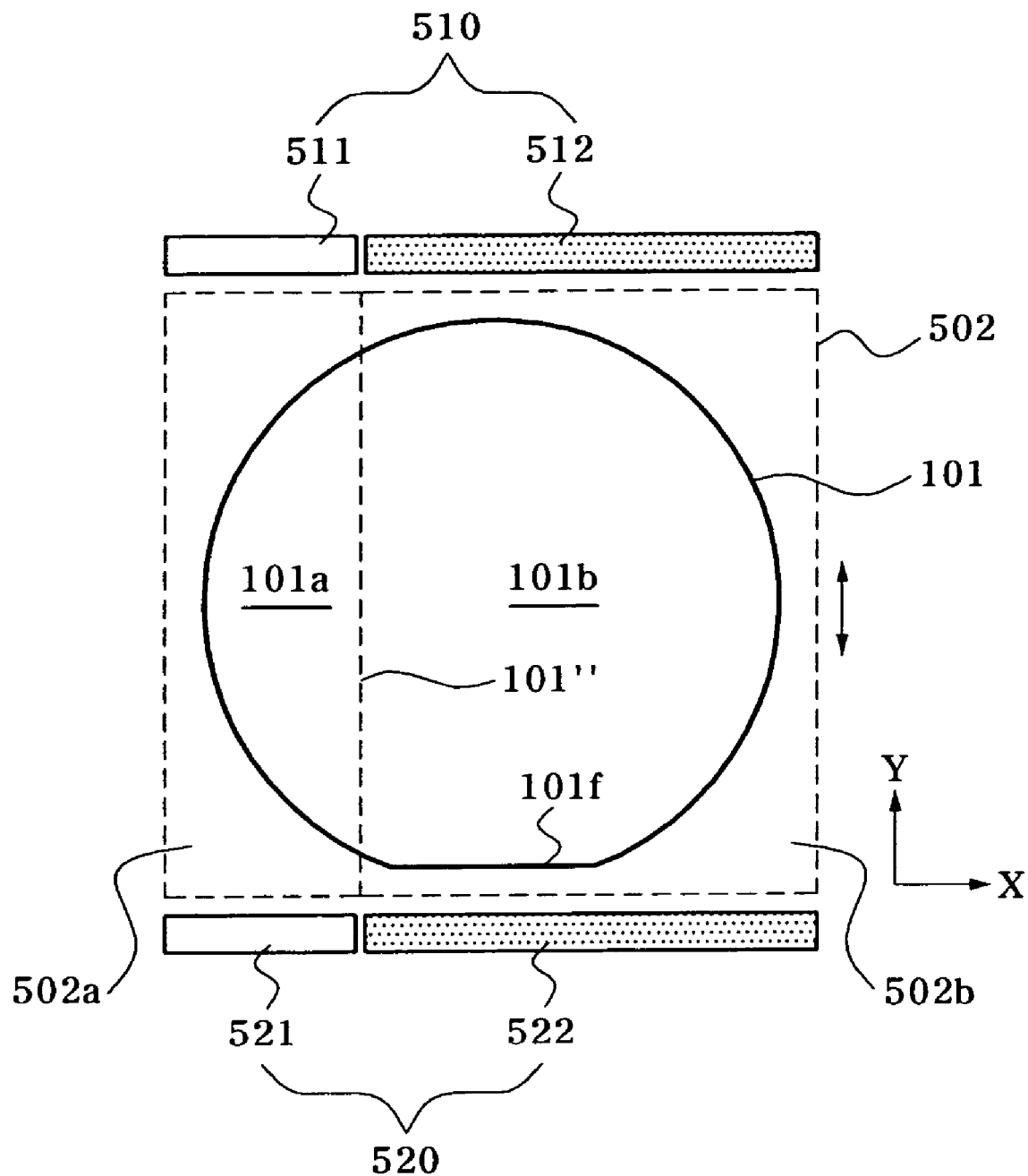
FIGS. 8 and 9 are exemplary simplified views of examples of the wafer and wide ion beam generator shown in FIG. 7 seen in the direction indicated by arrow A.
Figure 9:
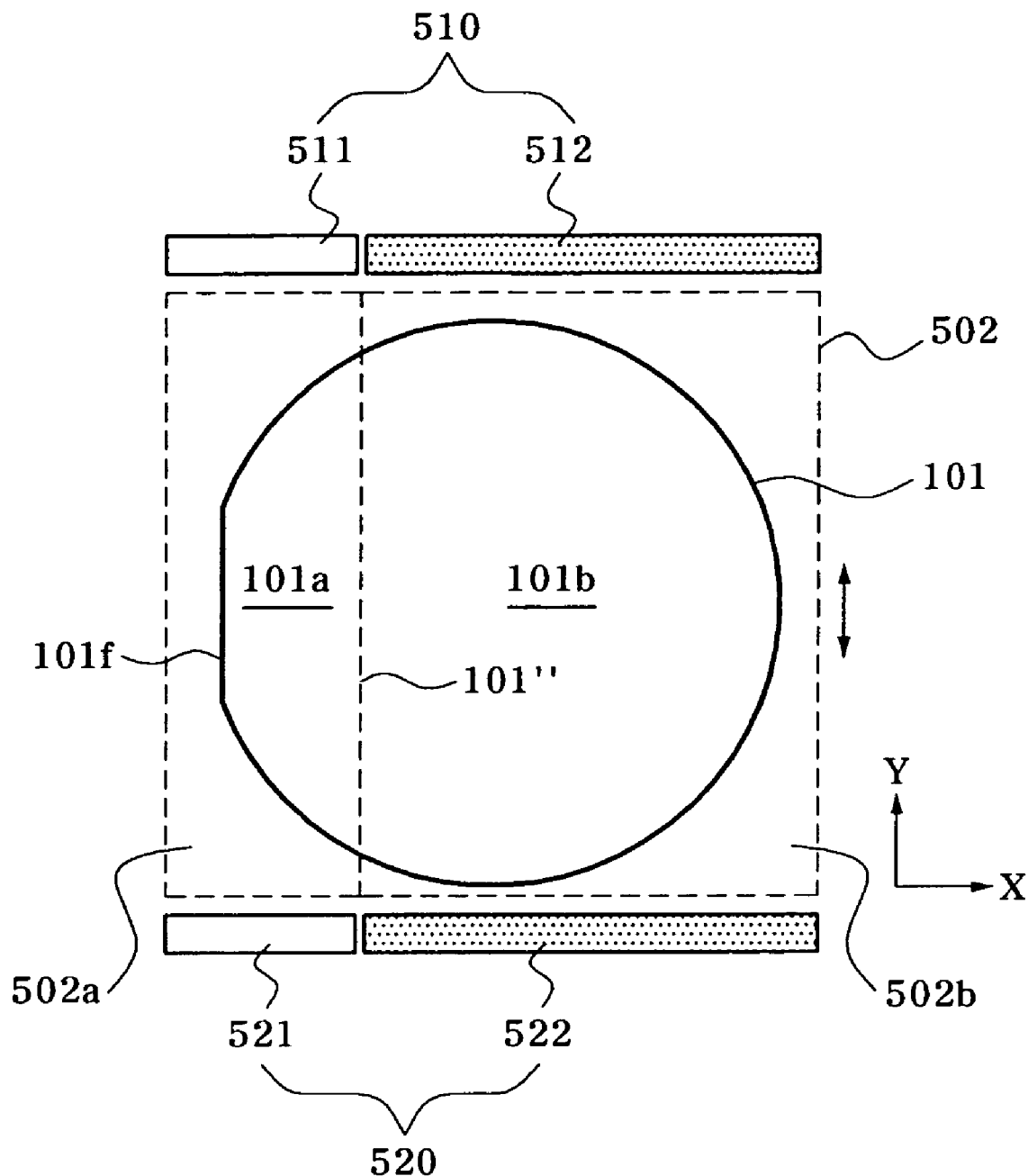

FIG. 7 is an exemplary simplified view illustrating a wide ion beam generator 500 of the nonuniform ion implantation apparatus shown in FIG. 3, and FIGS. 8 and 9 are exemplary simplified views of examples of the wafer and wide ion beam generator 500 shown in FIG. 7 seen in the direction indicated by the arrow A.

Referring first to FIG. 7, wide ion beam generator 500 comprises: an upper magnetron assembly 510 and a lower magnetron assembly 520 disposed below upper magnetron assembly 410 such that lower magnetron assembly 520 is vertically spaced a predetermined distance d from upper magnetron assembly 510. Upper magnetron assembly 510 includes a first upper magnetron assembly 511 comprising a plurality of magnetron elements 511-1, 511-2, ..., which are attached to each other side by side, and a second upper magnetron assembly 512 comprising a plurality of magnetron elements 512-1, 512-2, ..., which are attached to each other side by side. Lower magnetron assembly 520 includes a first lower magnetron assembly 521 comprising a plurality of magnetron elements 521-1, 521-2, ..., which are attached to each other side by side, and a second lower magnetron assembly 522 comprising a plurality of magnetron elements 522-1, 522-2, ..., which are attached to each other side by side. In a specific embodiment, wide ion beam generator 500 is different from wide ion beam generator 400 described with reference to FIG. 4 in that the number of magnetron elements 511-1, 511-2, ... and magnetron elements 521-1, 521-2, ... is less than the number of magnetron elements 512-1, 512-2, ... and magnetron elements 522-1, 522-2, ....

As the structure of wide ion beam generator 500 is different from that of wide ion beam generator 400, wide ion beam generator 500 generates a plurality of wide ion beams 502 different from the plurality of wide ion beams 402 generated by wide ion beam generator 400. In a specific embodiment as shown in FIGS. 8 and 9, a first wide ion beam 502a generated by magnetron elements 511-1, 511-2, ... and magnetron elements 521-1, 521-2, the number of which is relatively small, has a relatively small area. On the other hand, a second wide ion beam 502b generated by magnetron elements 512-1, 512-2, . . . and magnetron elements 522-1, 522-2, the number of which is relatively large, has a relatively large area. When a relatively low voltage is applied to first upper magnetron assembly 511 and first lower magnetron assembly 521, and a relatively high voltage is applied to second upper magnetron assembly 512 and second lower magnetron assembly 522, first wide ion beam 502a has a relatively low dose, and second wide ion beam 502b has a relatively high dose. When the high voltage is applied to first upper magnetron assembly 511 and first lower magnetron assembly 521, and the low voltage is applied to the second upper magnetron assembly 512 and the second lower magnetron assembly 522, on the other hand, first wide ion beam 502a has a relatively high dose, and second wide ion beam 502b has a relatively low dose.

FIG. 8 illustrates the nonuniform ion implantation performed using wide ion beam generator 500 while wide ion beam generator 500 is moved vertically, i.e., in the Y direction, after wafer 101 is disposed such that flat zone 101f of wafer 101 faces downward. On the other hand, FIG. 9 illustrates the nonuniform ion implantation performed using wide ion beam generator 500 while wide ion beam generator 500 is moved vertically, i.e., in the Y direction, after wafer 101 is disposed such that flat zone 101f of wafer 101 faces left. First region 101a and second region 101b of wafer 101, into which dopant ions having different doses are implanted are separated from each other by a boundary line 101". The locations of first region 101a and second region 101b in wafer 101 when flat zone 101f of wafer 101 faces downward as shown in FIG. 8 is different from the locations of first region 101a and second region 101b in wafer 101 when flat zone 101f of wafer 101 faces left as shown in FIG. 9. As wafer 101 is rotated a predetermined angle, the location of first region 101a, which has a small area and into which impurities having a first dose are implanted, and the location of second region 101b, which has a relatively large area and into which impurities having a second dose are implanted, are properly controlled.

Figure 10:
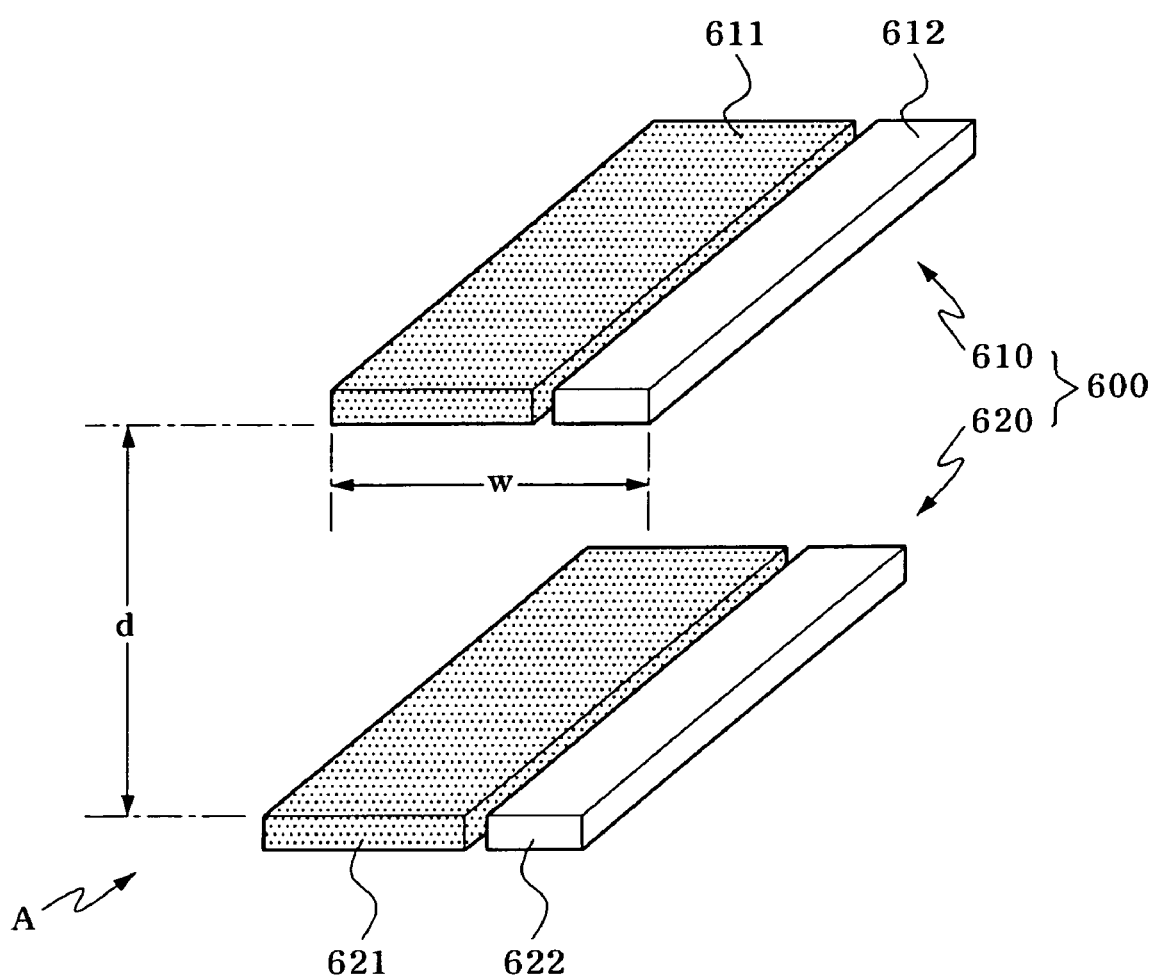
FIG. 10 is an exemplary simplified view illustrating a wide ion beam generator of the nonuniform ion implantation apparatus shown in FIG. 3 according to a specific embodiment.
Figure 11:
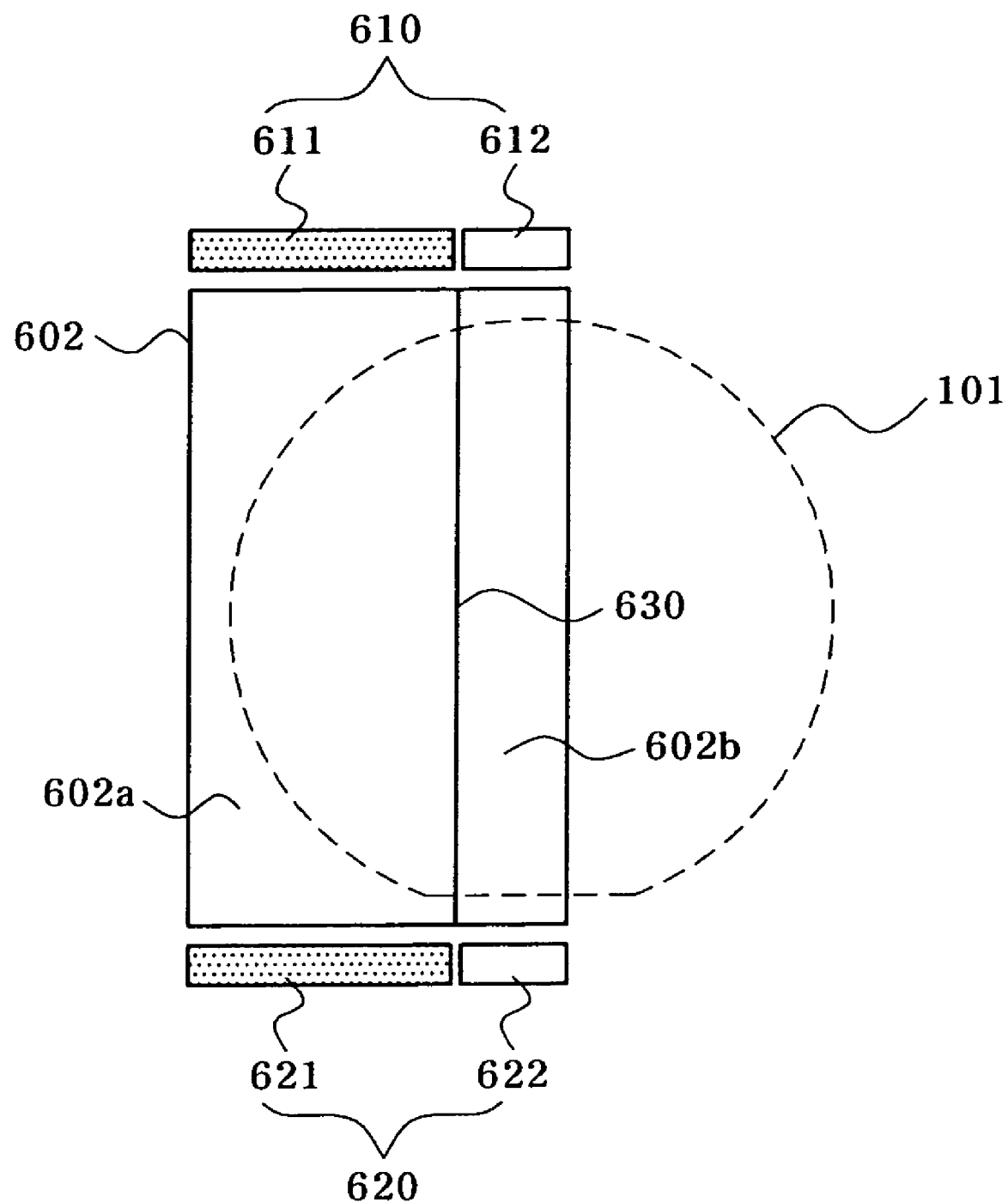
FIG. 11 is an exemplary simplified view of the wide ion beam generator shown in FIG. 10 seen in the direction indicated by arrow A.

FIG. 10 is an exemplary simplified view illustrating a wide ion beam generator 600 of the nonuniform ion implantation apparatus shown in FIG. 3 according to a specific embodiment, and FIG. 11 is a view of wide ion beam generator 600 shown in FIG. 10 seen in the direction indicated by the arrow A.

Referring to FIGS. 10 and 11, wide ion beam generator 600 comprises: an upper magnetron assembly 610 and a lower magnetron assembly 620 disposed below upper magnetron assembly 610 such that lower magnetron assembly 620 is vertically spaced a predetermined distance d from upper magnetron assembly 610. Upper magnetron assembly 610 includes a first upper magnetron assembly 611 and a second upper magnetron assembly 612. Lower magnetron 620 includes a first lower magnetron assembly 621 and a second lower magnetron assembly 622. Although not shown in the drawings, first upper magnetron assembly 611 comprises a plurality of magnetron elements, and second upper magnetron assembly 612 comprises a plurality of magnetron elements. In a specific embodiment, the number of magnetron elements in first upper magnetron assembly 611 is different from that of the magnetron elements in second upper magnetron assembly 612, although the number of magnetron elements in first upper magnetron assembly 611 may be equal to that of the magnetron elements in second upper magnetron assembly 612. In a specific embodiment, first lower magnetron assembly 621 may comprise a plurality of magnetron elements, and second lower magnetron assembly 622 may comprise a plurality of magnetron elements.

In a specific embodiment, wide ion beam generator 600 is different from the wide ion beam generators 400 and 500 shown in FIGS. 4 and 7. Wide ion beam generator 600 comprises first and second upper magnetron assemblies 611 and 612, the total width w of which is half of the diameter of wafer 101, and first and second lower magnetron assemblies 621 and 622, the total width w of which is also half of the diameter of wafer 101. Consequently, a plurality of wide ion beams generated by wide ion beam generator 600 is not irradiated on the entire area of wafer 101 but is irradiated on only half of the entire area of wafer 101. In a specific embodiment, plurality of wide ion beams 602 generated by wide ion beam generator 500 comprises a first wide ion beam 602a having a first dose and a second wide ion beam 602b having a second dose. First wide ion beam 602a is generated by first upper magnetron assembly 611 and first lower magnetron assembly 621, and second wide ion beam 602b is generated by second upper magnetron assembly 612 and second lower magnetron assembly 622. Consequently, when a relatively high voltage is applied to first upper magnetron assembly 611 and first lower magnetron assembly 621, and a relatively low voltage is applied to second upper magnetron assembly 612 and second lower magnetron assembly 622, the first dose of first wide ion beam 602a is higher than the second dose of second wide ion beam 602b.

Figure 12:
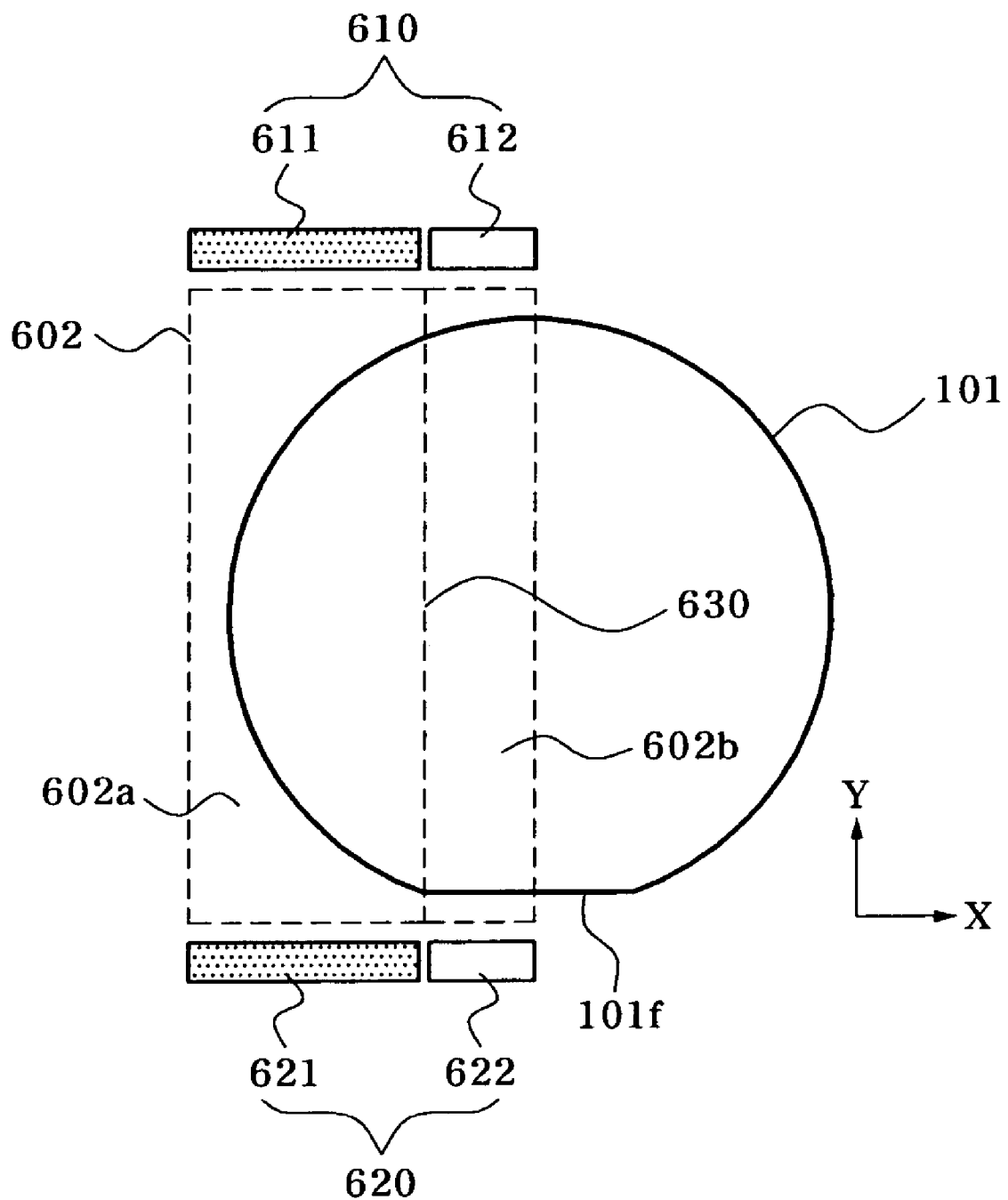
FIGS. 12 and 13 are exemplary simplified views illustrating a nonuniform ion implantation method using the wide ion beam generator shown in FIG. 10.
Figure 13:
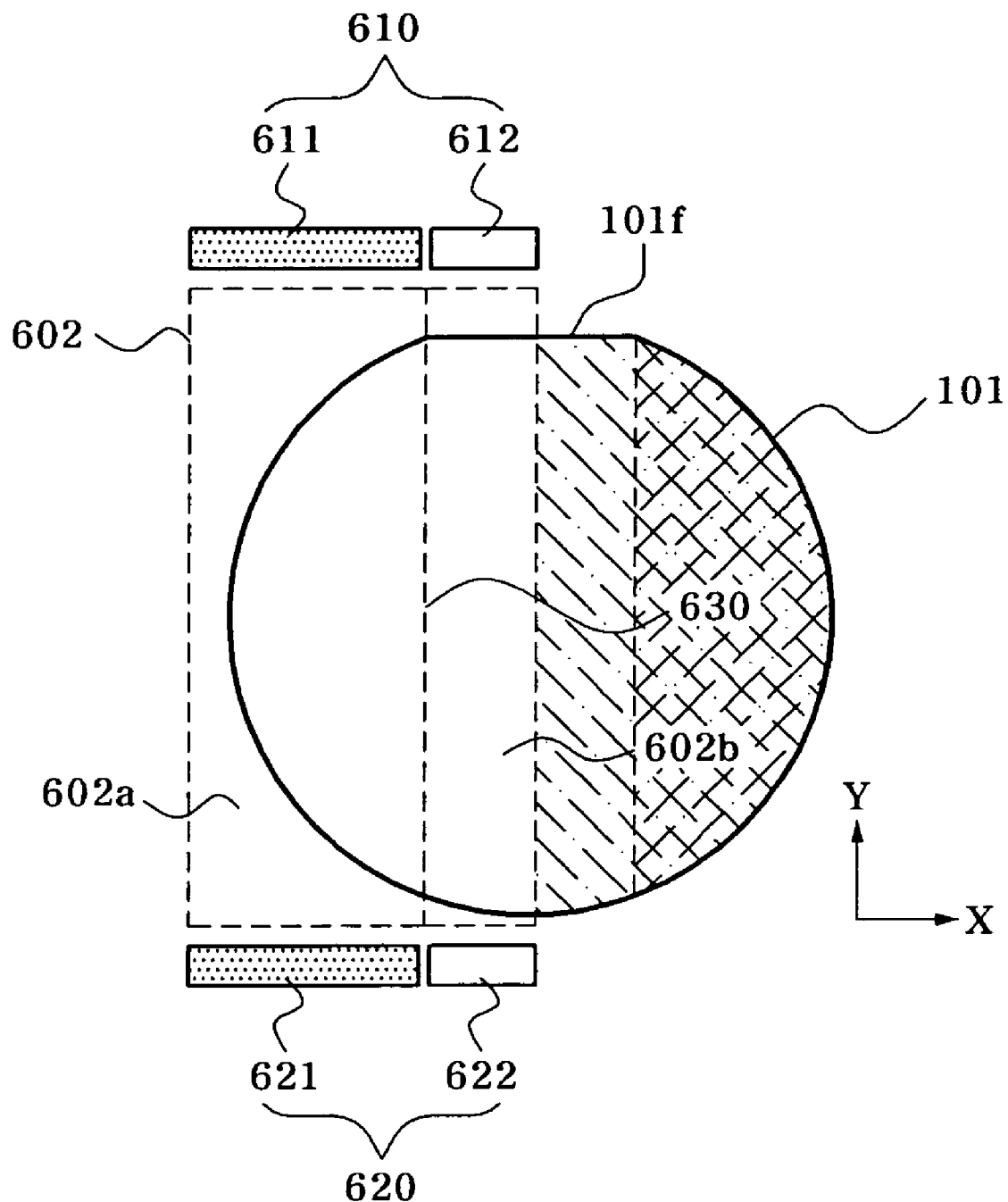
Figure 14:
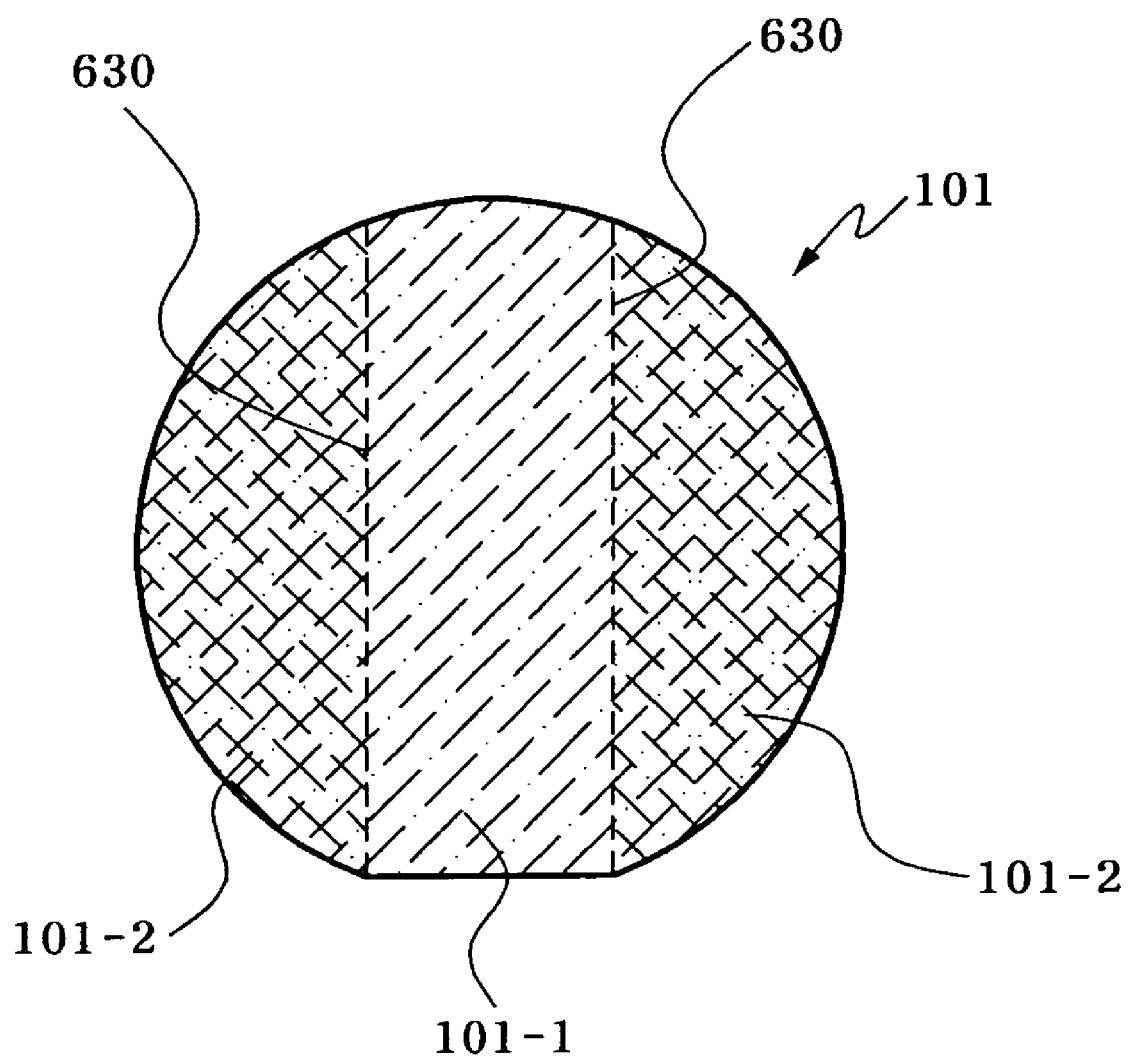
FIG. 14 is a view illustrating the dopant concentration distribution of a wafer having ions implanted by the nonuniform ion implantation method using the wide ion beam generator shown in FIG. 10.

FIGS. 12 and 13 are exemplary simplified views illustrating a nonuniform ion implantation method using wide ion beam generator 600 shown in FIG. 10, and FIG. 14 is an exemplary simplified view illustrating dopant concentration distribution of a wafer having ions implanted by the nonuniform ion implantation method using wide ion beam generator 600 shown in FIG. 10.

Referring first to FIG. 12, a plurality of wide ion beam 602 is generated by wide ion beam generator 600, and is then irradiated on wafer 101. Wafer 101 is disposed such that flat zone 101f of wafer 101 faces downward. Wafer 101 is moved in the Y direction while the ion implantation is performed. Plurality of wide ion beams 602 is irradiated on half of the entire area of wafer 101. Consequently, the first dose of dopant ions is implanted into the area of wafer 101 on which first wide ion beam 602a is irradiated, and the second dose of dopant ions is implanted into the area of wafer 101 on which second wide ion beam 602b is irradiated. First wide ion beam 602a and second wide ion beam 602b are separated from each other by a boundary line 630. At this time, dopant ions are not implanted into the other half of the area of wafer 101, on which plurality of wide ion beams 602 is not irradiated.

Referring now to FIG. 13, wafer 101 is disposed such that flat zone 101f of wafer 101 faces upward. As a result, plurality of wide ion beams 602 is irradiated on the other half of the area of wafer 101, on which the plurality of wide ion beams 602 has not been irradiated. Specifically, plurality of wide ion beams 602 is irradiated on the other half of the area of wafer 101 while wafer 101 is moved in the Y direction. Consequently, the first dose of dopant ions is implanted into the area of wafer 101 on which first wide ion beam 602a is irradiated, and the second dose of dopant ions is implanted into the area of wafer 101, on which second wide ion beam 602b is irradiated.

When the nonuniform ion implantation is performed on wafer 101 as shown in FIG. 14, the dopant ions are implanted into wafer 101. In a specific embodiment, wafer 101 is divided into a first section 101-1, which is the middle section of wafer 101, and two second sections 101-2, which are edge sections of wafer 101 disposed at opposite sides of first section 101-1 by two vertical boundary lines 630. Different doses of dopant ions are implanted into first section 101-1 and second sections 101-2. First section 101-1 is a section in which the second dose of dopant ions is implanted by second wide ion beam 602b, and second sections 101-2 are sections in which the first dose of dopant ions is implanted by first wide ion beam 602a.

Figure 15:
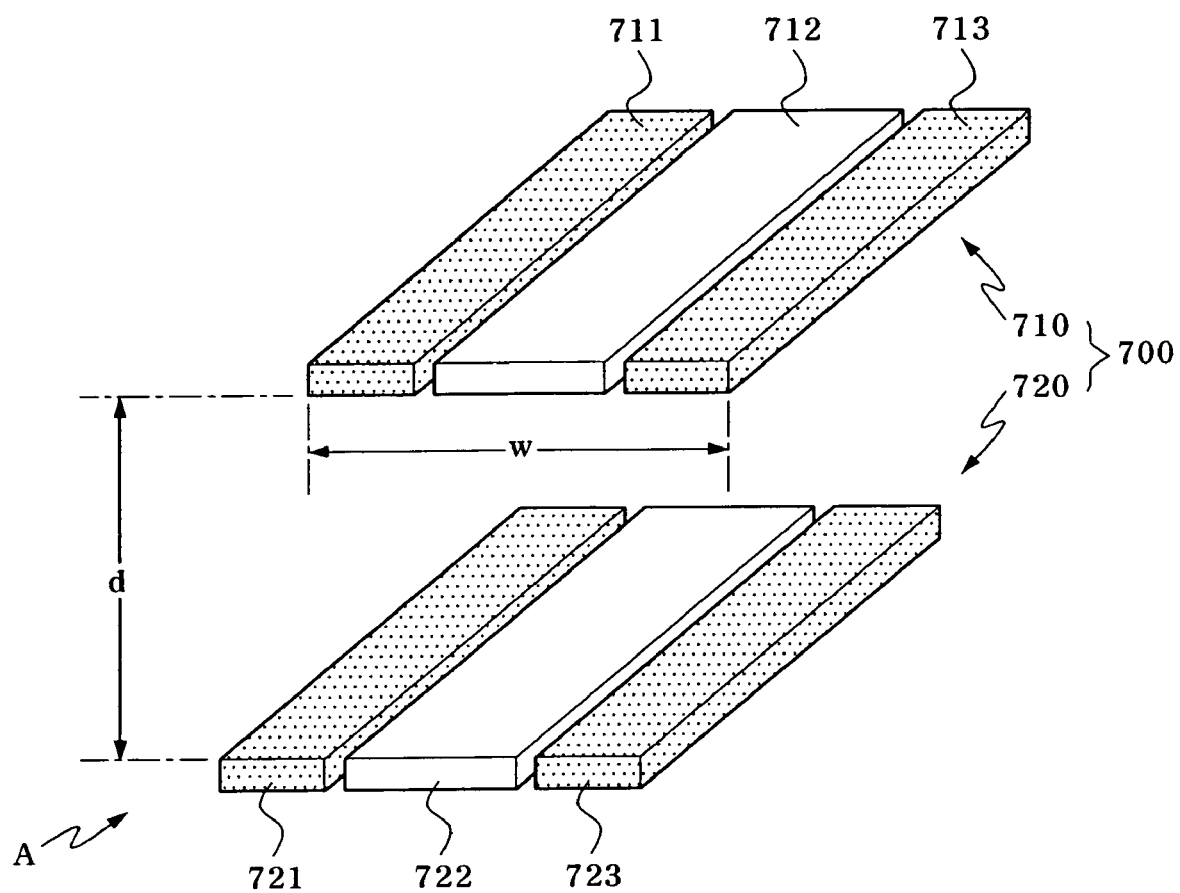
FIG. 15 is an exemplary simplified view illustrating a wide ion beam generator of the nonuniform ion implantation apparatus shown in FIG. 3.
Figure 16:
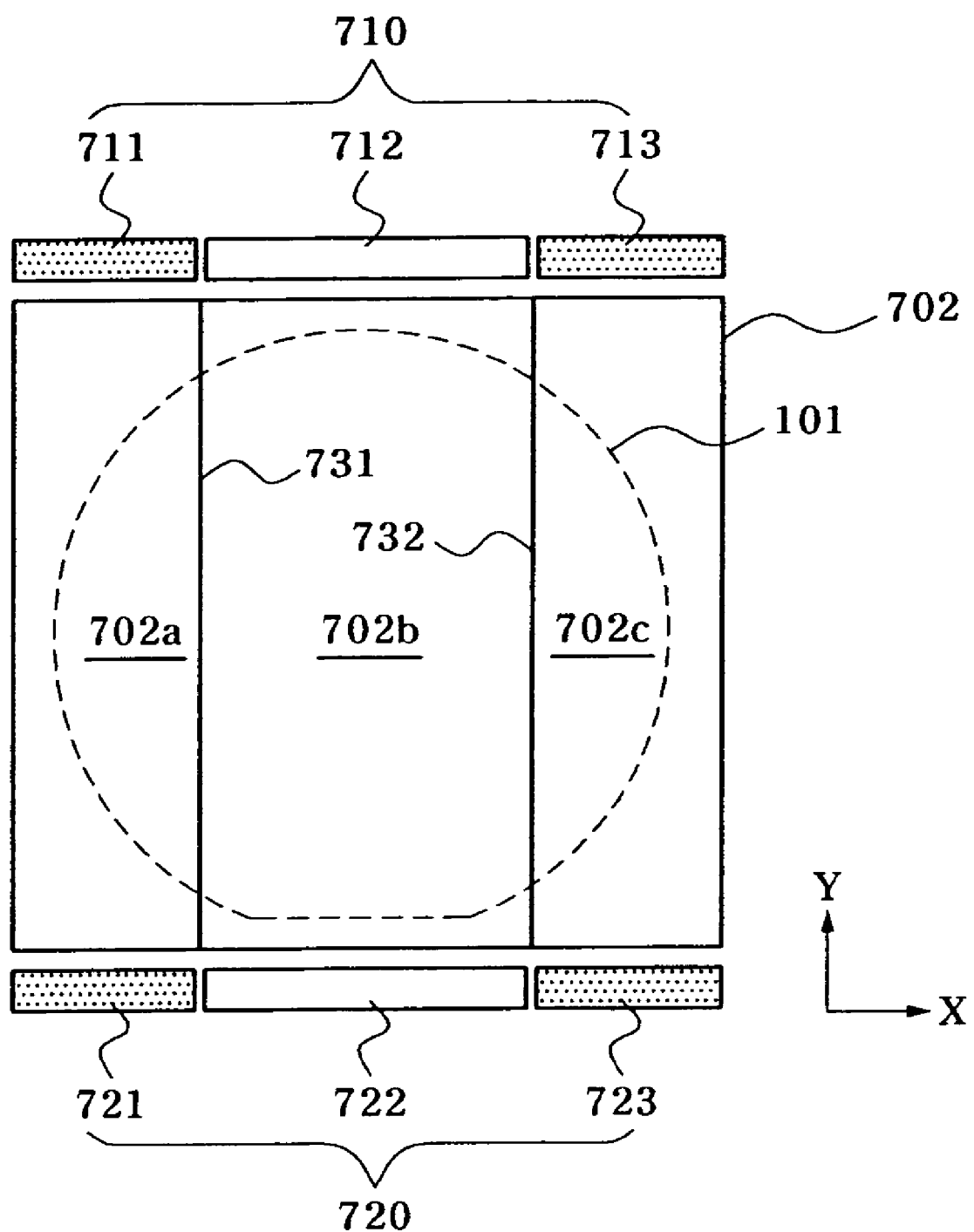
FIG. 16 is an exemplary simplified view of the wide ion beam generator shown in FIG. 15 seen in the direction indicated by the arrow A.

FIG. 15 is an exemplary simplified view illustrating a wide ion beam generator 700 of the nonuniform ion implantation apparatus shown in FIG. 3 according to a specific embodiment of the present invention, and FIG. 16 is an exemplary simplified view of wide ion beam generator 700 shown in FIG. 15 seen in the direction indicated by the arrow A.

Referring to FIGS. 15 and 16, wide ion beam generator 700 comprises: an upper magnetron assembly 710 and a lower magnetron assembly 720 disposed below upper magnetron assembly 710 such that lower magnetron assembly 720 is vertically spaced a predetermined distance d from upper magnetron assembly 710. The vertical distance d between upper magnetron assembly 710 and lower magnetron assembly 720 is greater than the diameter of wafer 101. Also, the width w of upper magnetron assembly 710 is greater than the diameter of wafer 101, and the width w of lower magnetron assembly 720 is greater than the diameter of wafer 101. However, the width w of the upper magnetron assembly 710 may be half of the diameter of wafer 101, and the width w of lower magnetron assembly 720 may be half of the diameter of wafer 101, in a specific embodiment. Upper magnetron assembly 710 includes a first upper magnetron assembly 711, a second upper magnetron assembly 712, and a third upper magnetron assembly 713 which are disposed side by side. Lower magnetron assembly 720 includes a first lower magnetron assembly 721, a second lower magnetron assembly 722, and a third lower magnetron assembly 723, which are disposed side by side. First upper magnetron assembly 711 and first lower magnetron assembly 721 are disposed such that first upper magnetron assembly 711 and first lower magnetron assembly 721 are vertically opposite each other. In the same manner, second upper magnetron assembly 712 and second lower magnetron assembly 722 are disposed such that second upper magnetron assembly 712 and second lower magnetron assembly 722 are vertically opposite each other. Also, third upper magnetron assembly 713 and third lower magnetron assembly 723 are disposed such that third upper magnetron assembly 713 and third lower magnetron assembly 723 are vertically opposite each other.

Although not shown in the drawings, first, second, and third upper magnetron assemblies 711, 712, and 713 include pluralities of magnetron elements, and first, second, and third lower magnetron assemblies 721, 722, and 723 include pluralities of magnetron elements. In a specific embodiment, the number of magnetron elements within first, second, and third upper magnetrons 711, 712, and 713 are different from each other, although the number of magnetron elements within first, second, and third upper magnetron assemblies 711, 712, and 713 may be equal to each other. In a specific embodiment, the number of magnetron assemblies within first, second, and third lower magnetron assemblies 721, 722, and 723 are different from each other, although the number of magnetron elements within first, second, and third lower magnetron assemblies 721, 722, and 723 may be equal to each other. In a specific embodiment, the number of magnetron elements within first upper magnetron assembly 711 is equal to the number of magnetron elements within first lower magnetron assembly 721, the number of magnetron elements within second upper magnetron assembly 712 is equal to the number of magnetron elements within second lower magnetron assembly 722, and the number of magnetron elements within third upper magnetron assembly 713 is equal to the number of magnetron elements within third lower magnetron assembly 723.

A first voltage is applied to first upper magnetron assembly 711 and first lower magnetron assembly 721, a second voltage is applied to second upper magnetron assembly 712 and second lower magnetron assembly 722, and a third voltage is applied to third upper magnetron assembly 713 and third lower magnetron assembly 723. In a specific embodiment, the levels of the first, second, and third voltages are different from each other. As the voltages are applied to upper magnetron assembly 710 and lower magnetron assembly 720 as described above, a plurality of wide ion beams 702 are generated between upper magnetron assembly 710 and lower magnetron assembly 720. In a specific embodiment, plurality of wide ion beams 702 have the same area as wafer 101.

Plurality of wide ion beams 702 comprises a first wide ion beam 702a, a second wide ion beam 702b, and a third wide ion beam 702c. First wide ion beam 702a is generated by first upper magnetron assembly 711 and first lower magnetron assembly 721. Second wide ion beam 702b is generated by second upper magnetron assembly 712 and second lower magnetron assembly 722. Third wide ion beam 702c is generated by third upper magnetron assembly 713 and third lower magnetron assembly 723. First wide ion beam 702a and second wide ion beam 702b are separated from each other by a first vertical boundary line 731, and second wide ion beam 702b and third wide ion beam 702c are separated from each other by a second vertical boundary line 732. In a specific embodiment, first vertical boundary line 731 is a vertical line connecting the boundary between first upper magnetron assembly 711 and second upper magnetron assembly 712 and the boundary between first lower magnetron assembly 721 and second lower magnetron assembly 722. Also, second vertical boundary line 732 is a vertical line connecting the boundary between second upper magnetron assembly 712 and third upper magnetron assembly 713 and the boundary between second lower magnetron assembly 722 and third lower magnetron assembly 723. In a specific embodiment, the levels of the first, second, and third voltages are different from each other, and a first dose of first wide ion beam 702a, a second dose of second wide ion beam 702b, and a third dose of third wide ion beam 702c are different from each other in proportion to the levels of the first, second, and third voltages.

Figure 17:
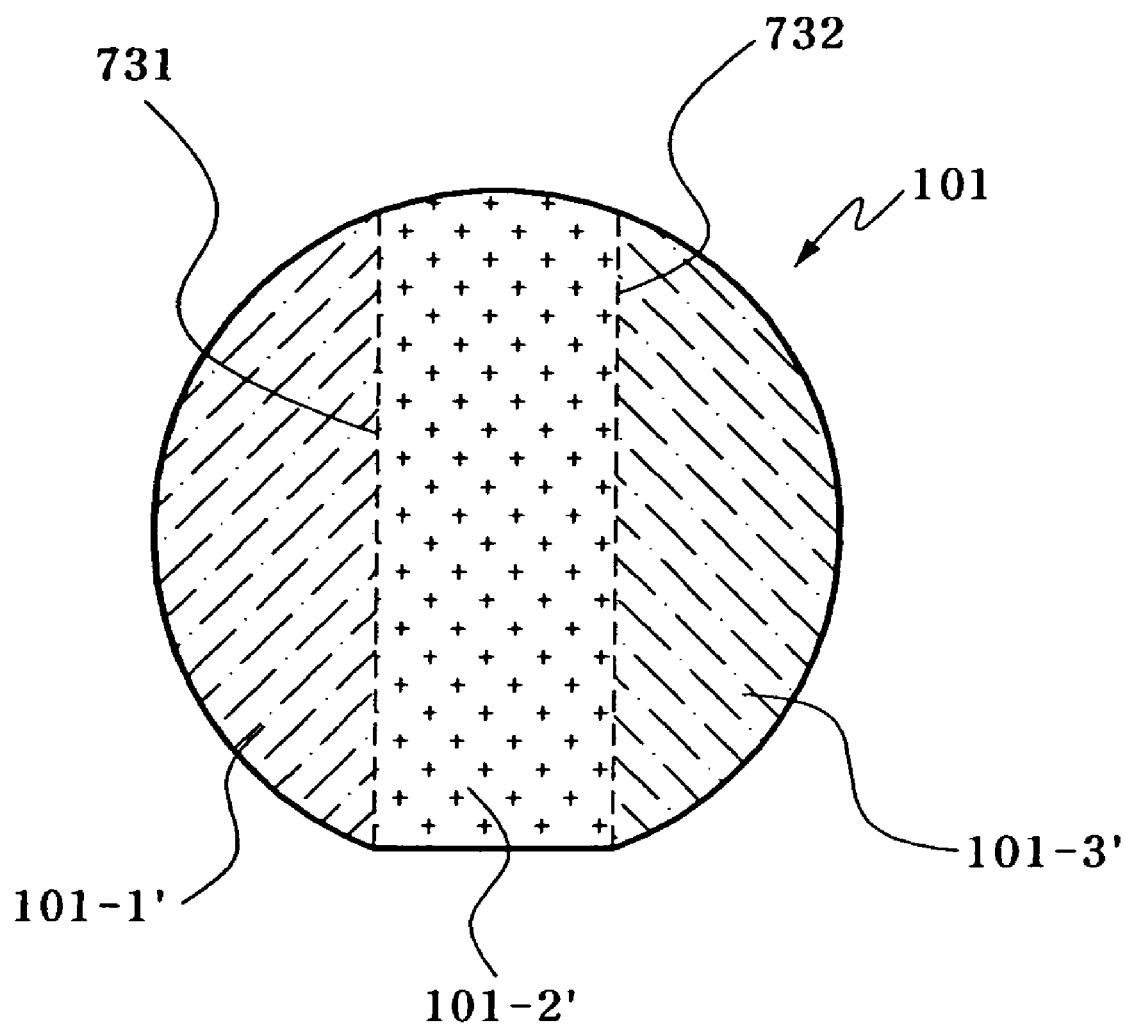
FIG. 17 is an exemplary simplified view illustrating the dopant ion concentration distribution of a wafer having ions implanted by the nonuniform ion implantation method using the wide ion beam generator shown in FIG. 15.

FIG. 17 is an exemplary simplified view illustrating dopant ion concentration distribution of a wafer having ions implanted by the nonuniform ion implantation method using wide ion beam generator 700 shown in FIG. 15.

Referring to FIG. 17 as well as FIGS. 15 and 16, plurality of wide ion beams 702 are generated by wide ion beam generator 700 and irradiated on wafer 101 while wafer 101 is moved in the Y direction. As a result, first, second, and third doses of dopant ions are implanted into a first section 101-1', a second section 101-2', and a third section 101-3' of wafer 101, which are separated from each other by first and second vertical boundary lines 731 and 732, respectively.

Figure 18:
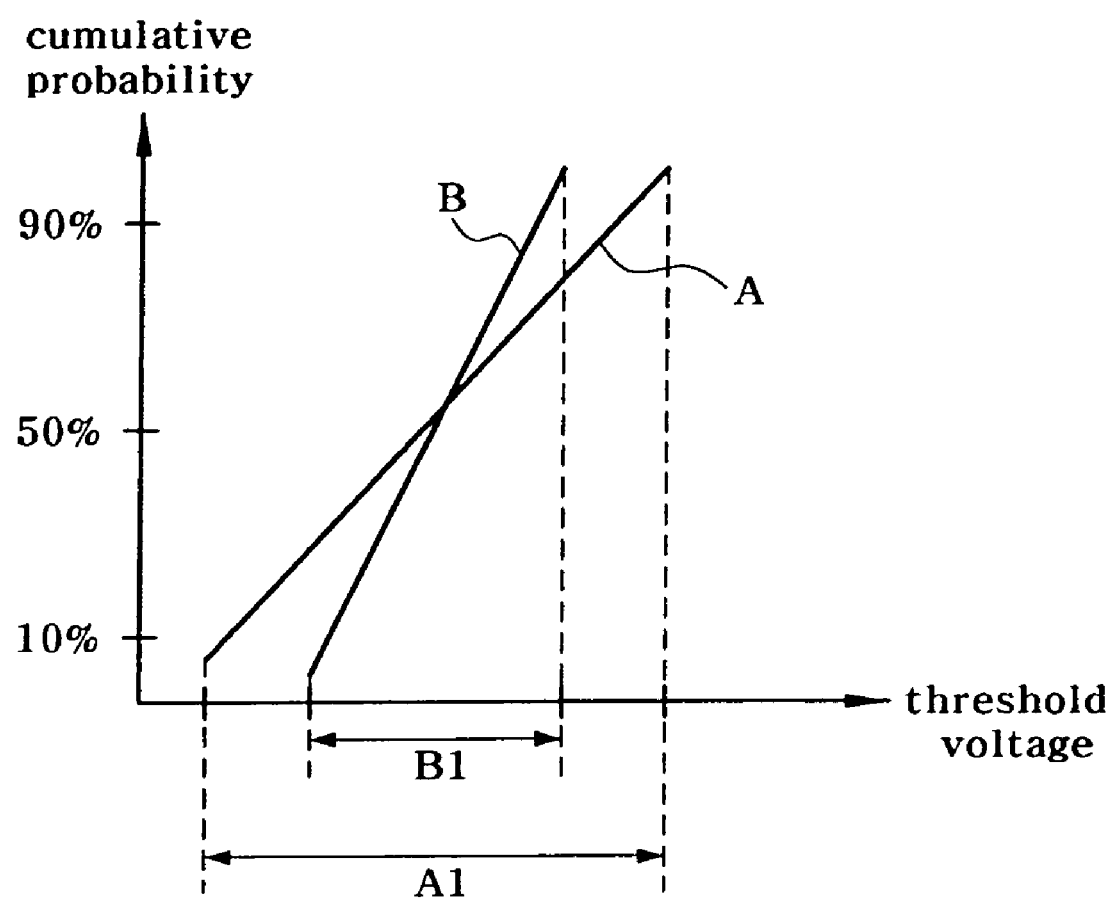
FIG. 18 is an exemplary simplified graph illustrating the comparison between cumulative probability of the threshold voltage acquired by the conventional ion implantation and cumulative probability of threshold voltage acquired by nonuniform ion implantation according to the present invention.

FIG. 18 is an exemplary graph illustrating the comparison between cumulative probability of threshold voltage acquired by conventional ion implantation and cumulative probability of threshold voltage acquired by nonuniform ion implantation.

As can be seen from the graph shown in FIG. 18, the cumulative probability of the threshold voltage acquired by the conventional ion implantation is distributed over a relatively wide range A1 as indicated by line A. On the other hand, the cumulative probability of the threshold voltage acquired by the nonuniform ion implantation according to the present invention is distributed over a relatively narrow range B1 as indicated by line B. The cumulative probability that nonuniform ion implantation and subsequent steps were successful in achieving the desired threshold voltage is higher for most nonuniform ion implantations performed according to embodiments of the invention as compared to conventional ion implantation processes. As a higher threshold voltage is greatly advantageous for circuits, the nonuniform ion implantation process yields significant benefits over conventional ion implantation processes. Consequently, it can be seen that the nonuniformity of the threshold voltage is improved throughout the wafer according to the present invention.

Although specific embodiments of the present invention have been disclosed for illustrative purposes, those skilled in the art will appreciate that various modifications, additions and substitutions are possible, without departing from the scope and spirit of the invention as disclosed in the accompanying claims. For example, the upper magnetron assembly may comprise first, second, third, and fourth upper magnetrons, and the lower magnetron assembly may comprise first, second, third, and fourth lower magnetrons. The number of upper and lower magnetrons may be further increased. Furthermore, the nonuniform ion implantation using the wide ion beam may be performed after the wafer is moved a predetermined distance not only in the vertical direction but also in the horizontal direction, or the wafer could be moved in a rotational manner prior to implantation.

As is made apparent from the above description, the plurality of wide ion beams, which comprise wide ion beams having different doses, is irradiated on the wafer, while the wafer is moved, in the nonuniform ion implantation apparatus and method using the plurality of wide ion beams according to the present invention. Consequently, the present invention has the effect of considerably increasing the difference in dose at the boundary between sections into which dopant ions having different concentrations are implanted.

What is claimed is:

1. A nonuniform ion implantation apparatus comprising:
a wide ion beam generator, including:
an upper magnetron assembly comprising a first upper magnetron assembly and a second upper magnetron assembly, and
a lower magnetron assembly comprising a first lower magnetron assembly and a second lower magnetron assembly disposed below the first upper magnetron assembly and the second upper magnetron assembly, such that the first lower magnetron assembly and the second lower magnetron assembly are vertically spaced a predetermined distance from the first upper magnetron assembly and the second upper magnetron assembly,
the upper and lower magnetron assemblies configured to generate a plurality of wide ion beams comprising at least a first wide ion beam generated between the first upper magnetron assembly and the first lower magnetron assembly and a second wide ion beam generated between the second upper magnetron assembly and the second lower magnetron assembly; and
a wafer drive unit for moving a wafer on which the wide ion beam is irradiated by the wide ion beam generator.

2. The apparatus as set forth in claim 1 further comprising:
an ion beam source for generating an ion beam; and
a magnetic pole assembly for magnifying and reducing an ion beam emitted from an ion beam source.

3. The apparatus as set forth in claim 1 wherein each of the first upper magnetron assembly, second upper magnetron assembly, first lower magnetron assembly, and second lower magnetron assembly comprise a plurality of magnetron elements.

4. The apparatus as set forth in claim 3, wherein the number of magnetron elements in the first upper magnetron assembly and the first lower magnetron assembly is equal to the number of magnetron elements in the second upper magnetron assembly and the second lower magnetron assembly.

5. The apparatus as set forth in claim 3, wherein the number of magnetron elements in the first upper magnetron assembly and the first lower magnetron assembly is not equal to the number of magnetron elements in the second upper magnetron assembly and second lower magnetron assembly.

6. The apparatus as set forth in claim 3, wherein the voltage applied to the first upper magnetron assembly and the first lower magnetron assembly is not equal to the voltage applied to the second upper magnetron assembly and the second lower magnetron assembly.

* * * * *